(12) United States Patent
Lu et al.

(10) Patent No.: US 6,608,775 B2
(45) Date of Patent: Aug. 19, 2003

(54) REGISTER FILE SCHEME

(75) Inventors: Shih-Lien L. Lu, Portland, OR (US); Konrad Lai, Vancouver, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/067,491

(22) Filed: Feb. 4, 2002

(65) Prior Publication Data

US 2002/0071305 A1 Jun. 13, 2002

Related U.S. Application Data (63) Continuation of application No. 09/606,577, filed on Jun. 28, 2000, now Pat. No. 6,430,083.

(51) Int. Cl.[7] .............................................. G11C 11/00
(52) U.S. Cl. ................................. 365/154; 365/189.05
(58) Field of Search ............................. 365/154, 189.05

(56) References Cited

U.S. PATENT DOCUMENTS

| | | | | |
|---|---|---|---|---|
| 4,669,061 A | * | 5/1987 | Bhavsar | 326/16 |
| 5,619,456 A | * | 4/1997 | McClure | 365/189.05 |
| 5,828,608 A | * | 10/1998 | Nguyen et al. | 365/154 |
| 5,973,529 A | * | 10/1999 | Chappell et al. | 327/200 |
| 6,014,036 A | * | 1/2000 | Bozso et al. | 326/21 |
| 6,058,041 A | | 5/2000 | Golke et al. | |

OTHER PUBLICATIONS

Tremblay, et al., "A Three Dimensional Register File For Superscalar Processors", Proceddings of the 28th Annual Hawaii International Conference on System Sciences IEEE 1995, pp. 191–201.

Weste, et al., "A Core Risc Microcontroller", 1992, Chapter 9.2, pp. 651–654.

* cited by examiner

Primary Examiner—Huan Hoang
(74) Attorney, Agent, or Firm—Howard A. Skaist (57) ABSTRACT

A circuit including a plurality of latches including feedback control circuitry and a plurality of data input terminals and data output terminals respectively coupled to alternative sides of said plurality of latches.

12 Claims, 8 Drawing Sheets

REGISTER FILE SCHEME

RELATED APPLICATION

This is a continuation patent application of patent application Ser. No. 09/606,577, filed on Jun. 28, 2000, now U.S. Pat. No. 6,430,083, titled "Register File Scheme," by Lu, et al., assigned to the assignee of the present invention and herein incorporated by reference.

BACKGROUND

1. Field

This disclosure relates to memory, and, more particularly, to register-file schemes.

2. Background Information

Processors, such as, for example, microprocessors (for consistency, hereinafter "microprocessor(s)") typically employ various levels of memory in what may be referred to as a memory hierarchy. In certain embodiments, the lowest level of such a memory hierarchy may be referred to as level zero (L0) memory and typically comprises what may be termed as register-files. Register-files are well-known to those of skill in the art and typically comprise full swing latches as storage elements for electrical data. In such embodiments, register-files are typically included as datapath elements. Datapaths, as employed in microprocessors, are well known to those of skill in the art. At a high level, in this context, a datapath comprises circuitry, which may be employed for performing computations or for executing instructions in such a microprocessor. Register-files, for example, may be used to store data related to these computations or instructions.

Because register-files are typically components of a datapath, they may affect the performance of a microprocessor and, in turn, a computing system in which such a microprocessor may be employed. In this regard, traditional register-files typically comprise multiple access ports, which are used for writing electronic data to and reading electronic data from such register-files. As microprocessor complexity increases, the number of such register file access ports and the number of register file entries typically increases as well. These increases in the number of ports may result in, for example, increased read and write access time for such register-files due to a number of factors. For example, increased parasitic impedance and gate-delays and may produce such increases in access time, which, in turn, may result in undesirable degradation in performance of a system, typically including a processor or microprocessor, employing such register files. Therefore, based on the foregoing, alternative register file schemes may be desirable.

BRIEF DESCRIPTION OF THE DRAWINGS

The subject matter regarded as the invention is particularly pointed out and distinctly claimed in the concluding portion of the specification. The invention, however, both as to organization and method of operation, together with features, and advantages thereof, may best be understood by reference to the following detailed description when read with the accompanying drawings in which:

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Computing systems, such as computing systems employing processors or microprocessors (hereafter "microprocessor(s)"), as was indicated above, typically utilize various levels of memory organized in a memory hierarchy. Such a memory hierarchy may employ various configurations for storing information at each of the various levels. Some examples of such configurations are cache memory, dynamic random access memory, disk drives and register-files. In such memory hierarchies, the lowest level of memory, typically referred to a level zero (L0), may comprise register-files as was previously discussed. As is known by those of skill in the art, L0 memory typically is employed as part of datapaths of a microprocessor and typically comprises these so called register-files.

Such a microprocessor, or other processor, to perform computations or execute instructions, for example, typically employs such datapaths. Such datapaths typically affect the overall performance of a microprocessor or system in which they are employed.

Figure 1:
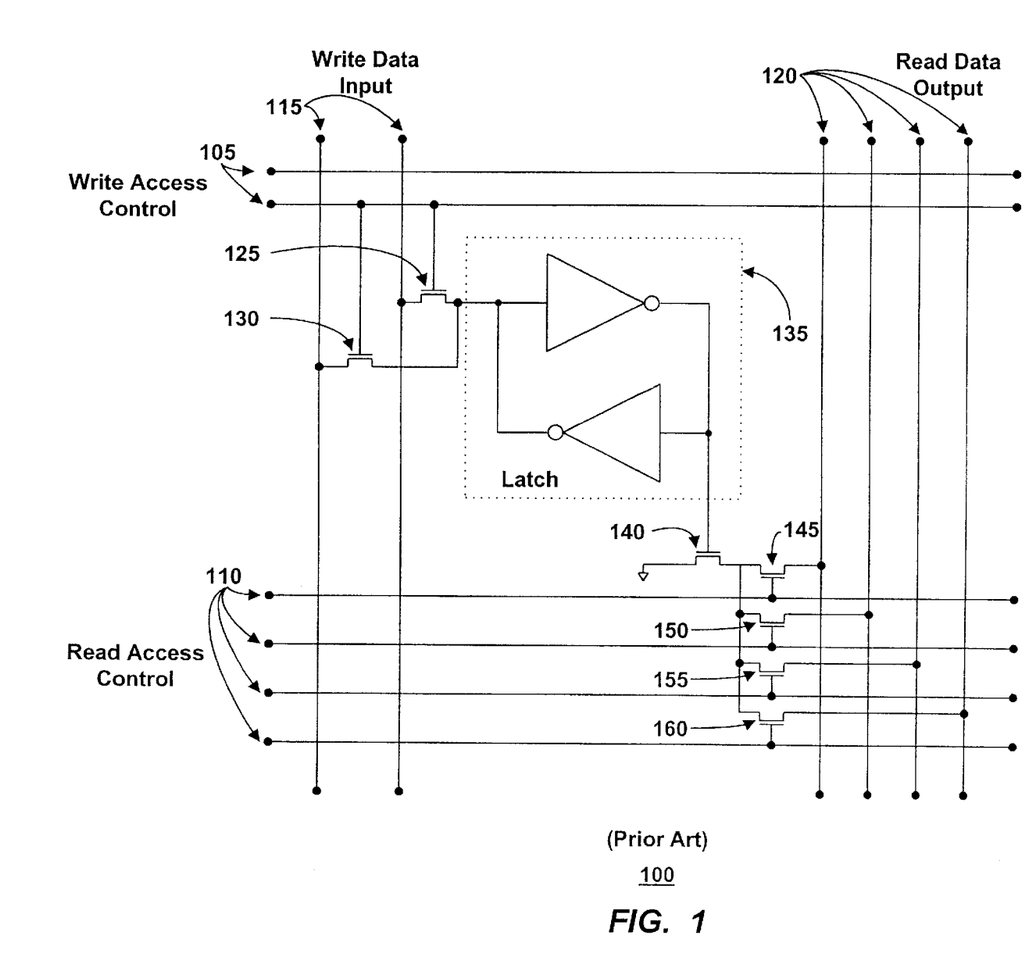
FIG. 1 is a schematic diagram illustrating a prior art embodiment of a register-file cell.

An example of a traditional implementation of a register-file cell is illustrated in FIG. 1. Such a cell would typically be employed in constructing a register-file circuit, such as may be used in a datapath of a microprocessor, for example. In this regard, for example, a 16-bit register-file may employ 16 such cells per entry. If such a register-file, for example, had 10 entries, or registers, 160 such cells would typically be employed, 16 cells per each of the 10 entries. As is well known in the art, such a configuration would typically include decode circuitry, which would be employed to access the desired register-file to either read or write a specific entry. In this respect, the register-file cell illustrated in FIG. 1 comprises two write ports, 115, and four read ports, 120. Such a register file may be referred to as a multi-ported register-file. This naming convention is due to such register files having a plurality of read and write ports. For this specific embodiment, transistors 125 and 130, based, at least in part on signals applied to write access control terminals 105, control which write port is activated for writing data into latch 135. Likewise, transistors 145, 150, 155 and 160, based, at least in part on signals applied to read access control terminals 110, control which read port is activated for reading any data stored in latch 135.

The configuration illustrated in FIG. 1 is, however, disadvantageous in a number of respects. For example, when a register file employing such register-file cells is embodied in an integrated circuit, the silicon area of such a register-file may be dependent on the metal lines used to carry the control signals, such as read and write control, which may also be referred to as word lines, and the metal lines used for the read and write ports, which may be referred to as bit-lines. As was indicated above, as microprocessor complexity increases, the number of access ports, both for reading and writing, may also increase. This is due to a number of factors and may depend, at least in part, on the particular embodiment. Such an increase in the number of access ports may, however, result in such a register-file consuming more silicon area if such a microprocessor is embodied, for example, on an integrated circuit (IC). In some circumstances, for example, the circuit area for such a register-file may increase in a substantially quadratic fashion based, at least in part, on the number of access ports. Likewise, as the number of ports increase, the area of such a register-file will be more heavily influenced by metal line density rather than latch density, which is typically undesirable.

Another disadvantageous aspect of the configuration illustrated in FIG. 1 is related to the foregoing. As the number of ports increase, the corresponding increase in metal lines for word lines and bit lines may result in a degradation in access time for reading and writing the register-file entries. This may result, at least in part, from parasitic impedance and delay added by the additional circuitry implementing the additional ports, for example. In turn, increases in access time may result in performance degradation for a microprocessor employing such a register-file, which may then adversely affect the performance of a computing system in which such a microprocessor might be employed.

The foregoing disadvantages may be compounded by the fact that, in certain embodiments, such as dynamically scheduled microprocessors, the number of entries in specific register-files may increase due to register renaming. Register renaming may be employed in dynamically scheduled microprocessors to reduce, for example, the performance impact of false dependencies that result from such processors executing instructions out of order (OOO). In this context, OOO means instructions may be executed in an order that does not match the strict linear order in which they are listed in a program being executed. In this context, strict linear order may be defined as the exact order the instructions occur in a software program. As is known in the art, this manner of OOO execution may result in improved performance as instructions may be executed when their operands are available, rather than in a strict linear order as defined in a software program. This manner of executing instructions may, however, create false dependencies, which could negatively impact performance. Such a false dependency may be illustrated by the following instruction sequence:

$R2=R1+R3$ $R2=R4+R5$

In this example, which may be termed a write after write hazard or false dependency, the two instructions are not dependent on one another, as the operands are independent. The fact that both results are placed in register 2 (R2) does not prevent both operations from being completed regardless of the order in which the microprocessor attempts to execute them. Without register renaming, the strict program order would need to be adhered to. If it were not, R2 may contain the wrong value, such as R1+R3, when accessed later in the program, in this example. If register renaming is employed, the effect may be as follows:

$P2=R1+R3$ $P3=R4+R5$

In this scenario, P2 and P3 would be renamed registers, each containing the desired contents of R2 from their respective operations. Therefore, in this example, the results of both instructions would be available regardless of the order in which they are executed in, for example, a dynamically scheduled or OOO processor. In such an embodiment, instruction execution resources may, therefore, be utilized more effectively due, at least in part, to register renaming.

While register renaming is advantageous from a performance perspective, as was previously indicated, the ability to employ this technique typically involves increasing the number of register-file entries in order to a have a sufficient number of such entries available for such renaming. This increase in the number of entries may, therefore, result in further increases in IC area, as previously discussed. These increases in the number of register-file entries and corresponding IC area, may, in turn, result in increased product cost and higher power consumption, for example, in such embodiments.

Figure 2:
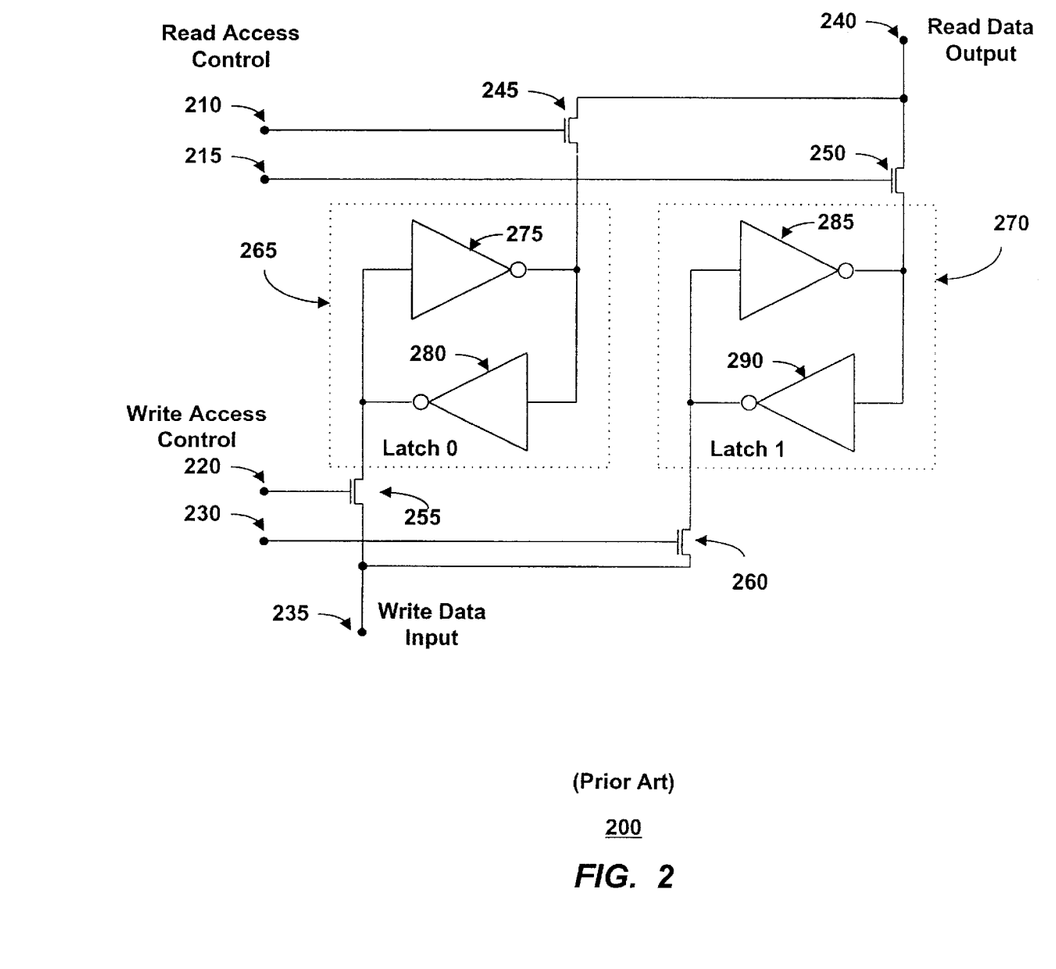
FIG. 2 is a schematic diagram illustrating a prior art embodiment of a three-dimensional (3D) register-file cell.

One technique that has been employed to attempt to address the foregoing concerns is illustrated in FIG. 2. This embodiment of a register-file cell may be referred to as a dual-latch configuration or a three-dimensional (3D) register-file cell. This embodiment employs two latches as compared to the traditional approach of employing one latch. While this may address some of the foregoing disadvantages, this approach is still disadvantageous in certain respects. For example, this technique employs both read and write access control, 210/215 and 220/230, respectively. This approach is disadvantageous in at least two respects. First, the transistors that are used to control access to each latch, 245 and 255 for latch 0 (265) and 250 and 260 for latch 1 (270), may adversely affect access time by adding gate delays to the read and write access time. Second, as additional latches are added to such an embodiment, the number of read and write access control signals increases. This is disadvantageous in a similar respect to the addition of read and write ports, as was previously discussed with respect to the traditional approach. For example, adding read access control signals and the corresponding transistors may adversely affect access time due, at least in part, to an increase in parasitic impedance, which may in turn impact microprocessor and computing system performance. This additional circuitry may result in an inefficient use of silicon area in a similar respect, as was discussed with respect to the traditional register-file configuration. Based on the foregoing, alternative configurations for register-files and register-file cells may be desirable.

Figure 3:
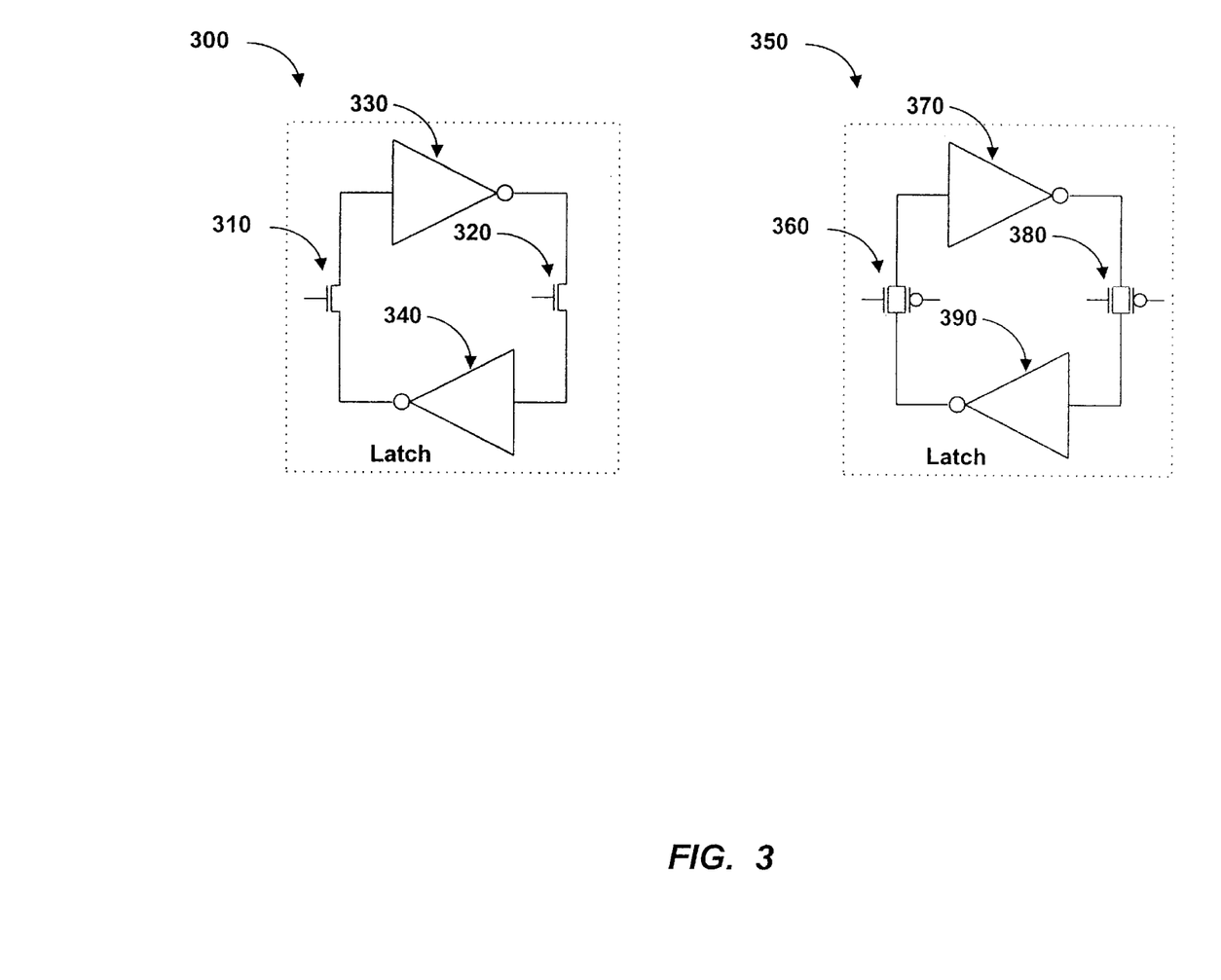
FIG. 3 is a schematic diagram illustrating two different embodiments of latches that may be employed by an embodiment of a register-file in accordance with the invention.

FIG. 3 illustrates two latch embodiments that may be employed by embodiments of register-file cells in accordance with the invention. Latch 300, illustrated in FIG. 3, for example, comprises two n-channel pass-gates, 310 and 320, which allow for feedback in such a latch to be controlled, for example, by a common control signal. Traditional latch configurations employing two inverters, such as 330 and 340, are well-known to those of skill in the art. Alternatively, latch 350 employs transmission gates for feedback control. Depending on the particular embodiment, use of transmission gates may reduce undesirable threshold voltage effects associated with n-channel pass-gates. Because such transmission gates comprise an n-channel and p-channel transistor, they do not result in a semiconductor junction voltage drop as may occur with a pass-gate. The invention is, of course, not limited in scope to these or any particular latch embodiment as alternative configurations may exist. The details of operation of these embodiments are described in more detail hereinafter.

Figure 4:
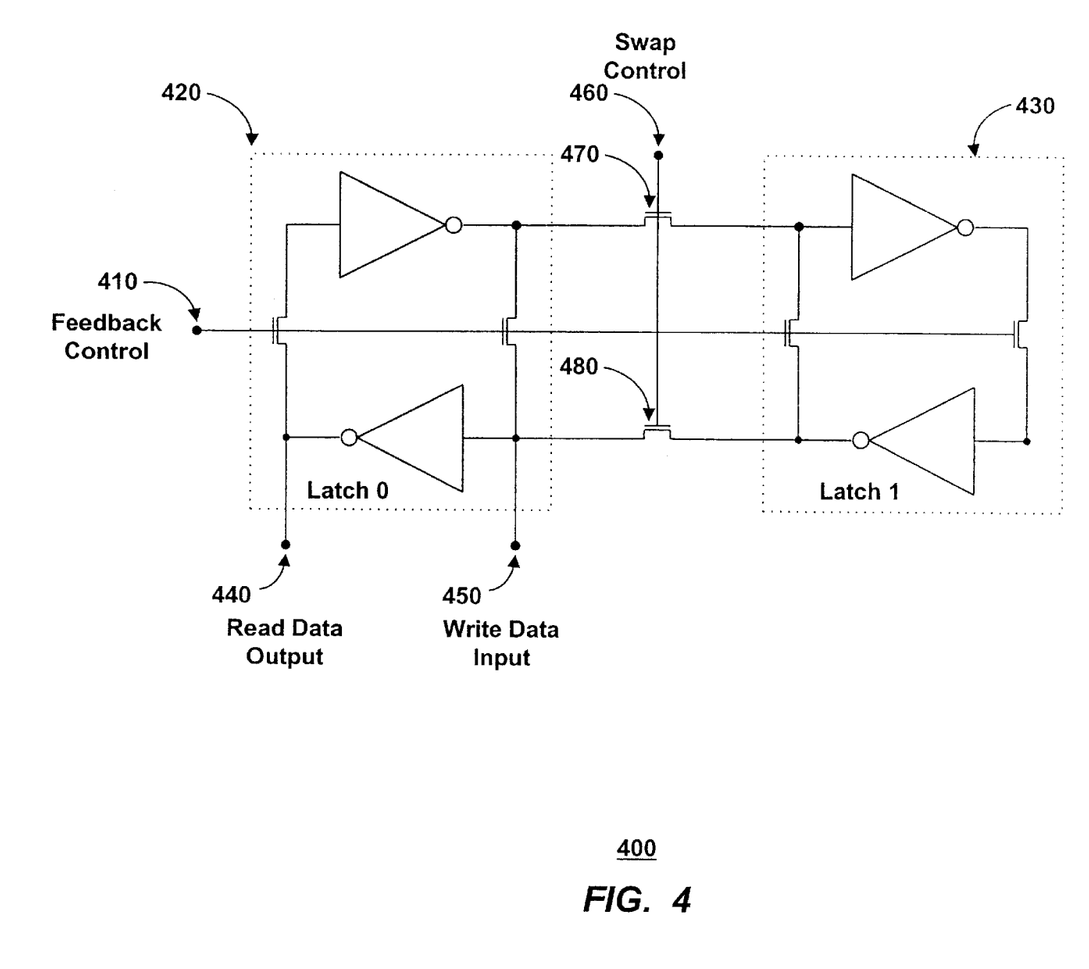
FIG. 4 is a schematic diagram illustrating an embodiment of a register-file cell in accordance with the invention.

FIG. 4 illustrates a schematic diagram of a register-file cell 400 in accordance with the invention, which addresses at least some of the foregoing disadvantages. This particular embodiment employs latches such as latch 300, illustrated in FIG. 3, though, of course, the invention is not limited in scope to any particular latch configuration. However, this particular embodiment of a register-file cell, 400, in accordance with the invention may be employed in implementing a register-file. Using register-file cells of this configuration, a dual-bank register-file may be constructed. In this respect, register-file cell 400 comprises two latches, 420 and 430. As was previously indicated, these latches comprise feedback control circuitry, specifically n-channel pass-gates in this particular embodiment, though the invention is not limited in scope in this respect. For this embodiment, a common signal is communicated via feedback control terminal 410 for both latches. In this respect, feedback for both latches may be either turned on or off in a substantially simultaneous manner. These pass-gates will typically be on, that is, the feedback paths will be electrically coupled when such a register-file cell is employed in, for example, a microprocessor. Those of skill in the art would understand that when electronic signals are being written or read from a register-file comprising such cells, the latch feedback paths would be electrically coupled in order to store, or latch, such electronic signals.

While previous embodiments presented access time concerns, this configuration may improve access times, based, at least in part, on the observation that the junction and overlap capacitance of the pass-gates will typically be less than the gate capacitance of the inverters in latches 420 and 430. This lower capacitance may reduce, for example, the time to charge an associated bit-line, thereby improving the access time to, for example, read data on read data output terminal 440. As will be discussed in more detail hereafter, this configuration may improve access time relative to previous configurations in other respects as well.

This particular embodiment comprises a single set of read and write ports, 440 and 450 respectively. Additionally, for a multi-banked architecture, which is discussed in more detail hereafter, access to all latches within the register-file cell may be accomplished through a single set of access ports. Therefore, additional circuitry for selecting a particular latch, such as the circuitry for selecting which latch to access in a 3D register-file cell, is not employed, which may improve access times. In this respect, for the particular embodiment illustrated in FIG. 4, latches 420 and 430 are coupled via pass-gates 470 and 480. These pass-gates may be employed to exchange, or swap, electronic signals stored in latches 470 and 480.

For an embodiment of a multi-banked architecture of register-files in accordance with the invention, such as one employing register-file cells such as 400, the plurality of read and write ports employed by traditional embodiments may be omitted. Such a multi-banked architecture may allow such register-files to be clustered with functional blocks of circuits in which they are employed. One of skill in the art would understand that such clustering may allow the use of a single set of access ports.

Though, of course, the invention is not limited in scope to any particular technique, such an exchange may be accomplished in the following manner. The feedback path for latches 420 and 430 would first be electrically decoupled by asserting an appropriate signal via feedback control terminal 410, for this particular embodiment, a digital logic zero ("logic 0"). Then, latches 420 and 430 would be electrically coupled via transistors 470 and 480 by asserting an appropriate signal via swap control terminal 460, for this embodiment, digital logic one ("logic 1"). Those of skill in the art would recognize that this would create a dual-dynamic latch configuration. In this respect, the digital logic value stored in latch 420 would be forwarded to latch 430 and, similarly, the digital logic value stored in latch 430 would be forwarded to latch 420, that is, the contents of the latches would be swapped. The latches would then be electrically decoupled by asserting the appropriate signal, logic 0 for this embodiment, via swap control terminal 460 and feedback in latches 420 and 430 would be electrically coupled by asserting the appropriate signal, logic 1 for this embodiment, via feedback control terminal 410. For typical embodiments, feedback control and swap control would be global to a particular register-file. In this respect, for such an embodiment, all banks of such a multi-banked register-file would be swapped substantially simultaneously in a comparable manner as was described for register-file cell 400.

The foregoing aspects of embodiments in accordance with the invention, such as 400, are advantageous in a number of respects. For example, for this particular embodiment, as was previously indicated, a decrease in access times due to decreased parasitic impedance may result when employing such an embodiment. In this regard, because access for reading and writing electronic signals to such a register-file may be accomplished with a single set of access ports, detrimental impacts on access time related to additional ports or latch selection circuitry may be addressed. Reducing the additional impedance and gate delays associated with metal lines for such ports and transistors for such latch selection circuitry may, in turn, result in this improvement to access times.

Figure 5:
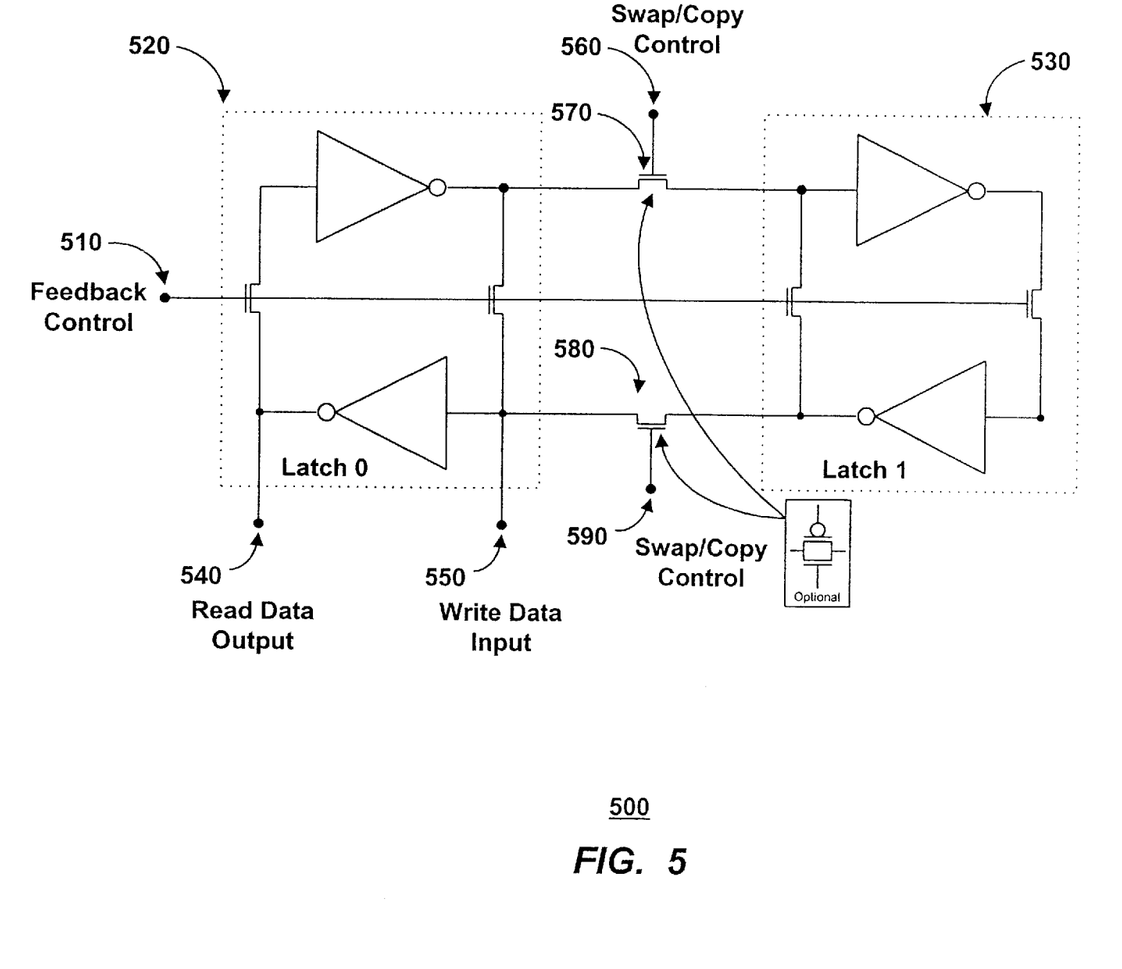
FIG. 5 is a schematic diagram of another embodiment of a register-file cell in accordance with the invention.

FIG. 5 illustrates an alternative embodiment of a register-file cell, 500, in accordance with the invention that is capable of reading the contents of one latch to the other latch in addition to swapping the contents of the latches, as was previously described. In this regard, while register-file cell 500 is similar to register-file cell 400, it employs an additional control signal to provide for this additional capability to read the contents of one or more latches, in addition to being capable of swapping the contents of one or more latches, as previously described. In this regard, latches 520 and 530 are coupled via transistors 570 and 580, which have separate control signal terminals, 560 and 590, as opposed to transistors 470 and 480, as illustrated in FIG. 4, which have a single control signal terminal, 460. Alternatively, as is indicated in FIG. 5, transmission gates may be employed rather than n-channel pass-gates. Depending on the particular embodiment, transmission gates may provide a performance benefit by reducing the effects of the threshold voltage drop associated with pass-gates, as was previously discussed, though of course the invention is not limited in scope in this respect.

For this particular embodiment, 500, the contents of the latches, 520 and 530, may be swapped, in a similar manner as was previously described with respect to FIG. 4, by asserting logic 1 on both swap/copy control terminals, 560 and 590, once the feedback paths in the latches have been electrically decoupled. Additionally, though the invention is not limited to any particular technique for reading the latch contents, by asserting logic 1 on only swap/copy control terminal 560 after electrically decoupling the latch feedback paths, for example, the contents of latch 520 may read from that latch to latch 530. Likewise, by asserting logic 1 on swap/copy control terminal 590 after electrically decoupling the latch feedback paths, the contents of latch 530 may be read from that latch to latch 520. By reading the contents from one latch to the other latch, the original contents of the latch being read remain intact as opposed to a swap operation, which may modify the contents of both latches.

In addition to the previously discussed advantages, register-files employing register-file cells such as 400 or 500, for example, may also provide additional performance advantages or benefits based, at least in part, on a multi-banked architecture of such register-files. Though, of course the invention is not limited in scope to any particular register-file cell configuration, the ability of these embodiments to swap register-file bank contents may be advantageous in certain embodiments. In this respect, for example, in an embodiment where multi-threading is employed, this ability to swap banks may be desirable. In this context, multi-threading may be defined as more than one thread, or stream or instructions, being executed using overlapping or related resources. In this situation, the ability to swap register-file bank contents may be advantageous when switching between threads. This swapping of bank contents may make it desirable to omit temporary storage and, in turn, the overhead associated with storing information related to one thread in order to switch to another thread. This capability may thereby result in improved performance for such an embodiment as switching between multiple threads may be accomplished more efficiently. In this respect, when it is desirable to switch threads, register-file contents may be swapped between banks, with each bank containing information related to a respective execution thread.

Embodiments of register-files that employ register-file cells with the additional capability to read the contents of register-file banks among a plurality of such banks, such as register-file cell 500, may provide additional performance advantages in certain embodiments. For example, though the invention is not limited in scope in this respect, for microprocessors that are capable of speculative execution, the ability to read register-file banks may be beneficial. In this regard, in such a microprocessor, the contents of the register-files in one bank could be read to another bank prior to initiating speculative execution. If at some point during this speculative execution, the microprocessor determines that the speculative path was incorrect, the pre-speculative contents of the register file could either be read or swapped back to the original bank, and the processor could then be returned to the pre-speculative state to resume execution from that point. This, again, may make omitting temporary storage and the associated overhead desirable, as was previously discussed.

Another example of a potential performance benefit, which the capability to read register-file bank contents may allow to be realized, may occur when a microprocessor receives an interrupt request. In such a situation, the contents of one register-file bank could be read to another register-file bank, the microprocessor might then execute instructions associated with the interrupt request, then the pre-interrupt register-file contents may be read or swapped back to their original bank. Execution may then be resumed at the pre-interrupt point. The foregoing benefits are, of course, provided as examples and may depend, at least in part, on the particular embodiment in which such register-files are employed. These examples, of course, in no way limit the scope of the invention nor do they represent all the potential benefits of employing embodiments of register-files cells in accordance with the invention.

Figure 6:
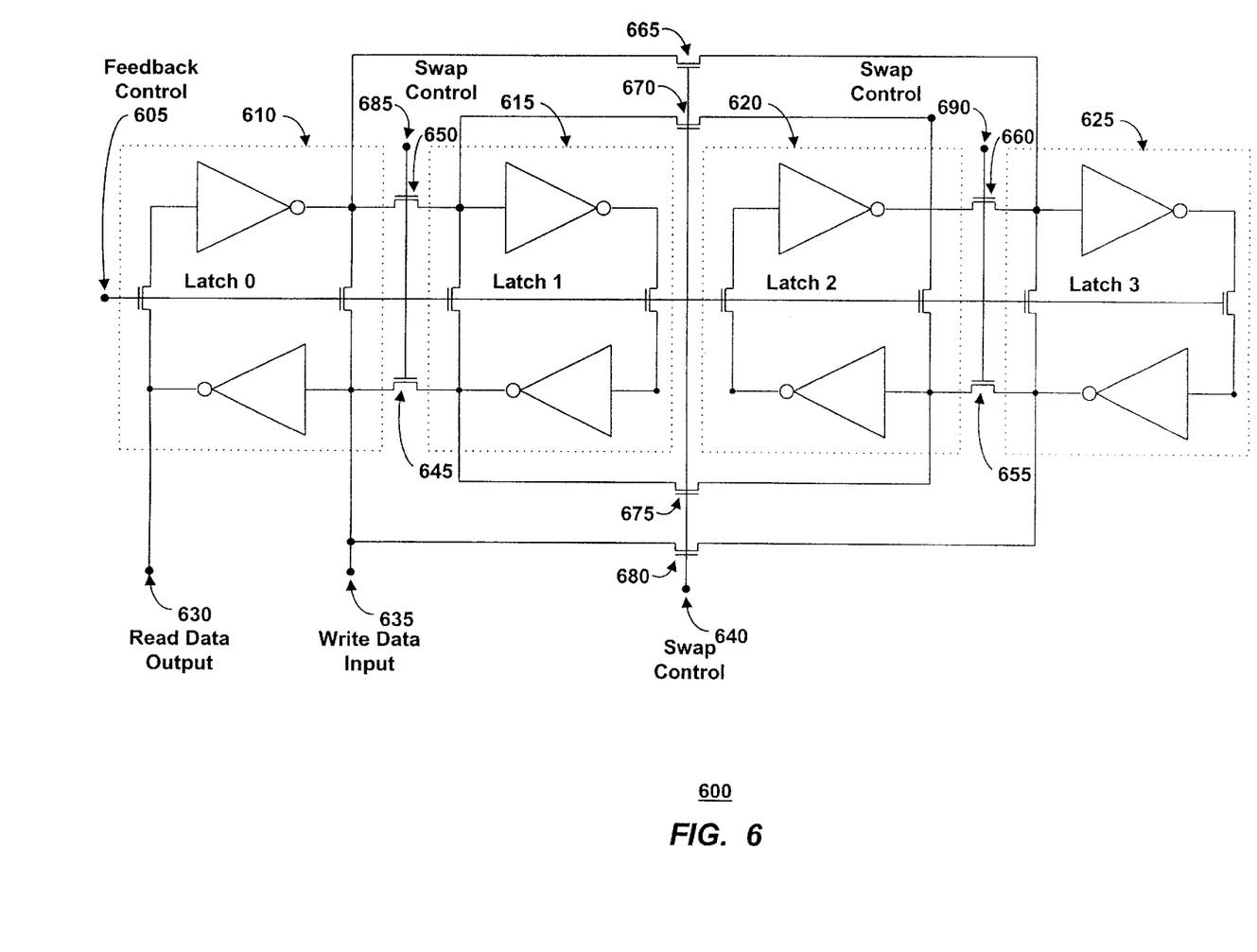
FIG. 6 is a schematic diagram of yet another embodiment of a register-file cell in accordance with the invention.

FIG. 6 illustrates another alternative embodiment of a register-file cell in accordance with the invention. While the invention is, of course, not limited in scope to this or any particular embodiment, register-file cells, such as 600, may be employed in a quad-bank register-file, for example. For this particular embodiment, two "cells" that are substantially similar to the register-file cell embodiment illustrated in FIG. 4 are employed. In this respect, one "cell" comprises latches 610 and 615, designated Latch 0 and Latch 1, respectively. Likewise, the second "cell" comprises latches 620 and 625, designated Latch 2 and Latch 3, respectively. These "cells" also comprise feedback control and are coupled so as to be capable of swapping the contents of their respective latches, as has been previously described. In this regard, Latch 0 may be swapped with Latch 1 and Latch 2 may be swapped with Latch 3. Register-file cell 600, however, as with register-file cells 400 and 500, comprises one read port and one write port, designated by the terminals read data output 630 and write data input 635, respectively.

For this embodiment, these two "cells" are further coupled via pass-gates 665, 670, 675 and 680. These pass-gates may be employed to swap the contents of Latch 0 and Latch 3 and the contents of Latch 1 and Latch 2, by employing a similar technique as previously discussed. This may be accomplished, for example, by applying a logic 1 to swap control terminal 640 after the latch feedback paths have been electrically decoupled. During such a swap, logic 0 would typically be applied to swap control terminals 685 and 690 so that only two latches are electrically coupled during a single swap operation. For example, were logic 1 applied to all three swap control terminals, 640, 685 and 690, latch 610 would be coupled to both latch 615 and latch 625, which may result in the desired swap not being performed properly or in one or more banks being corrupted.

Also, though not illustrated in FIG. 6, in certain embodiments, swap control terminals 685 and 690 may be driven from substantially the same signal source to allow the contents of "cells" to be swapped by employing a single control signal. The invention is, of course, not limited in scope to this particular embodiment or such a modification and many additional alternatives or modifications may exist. For example, transmission gates rather than pass-gates may be employed, additional control signals might be employed to allow reading as well as swapping, as has been previously described, or additional "cells" may be added with corresponding pass-gates to allow for register-files with larger numbers of banks to be constructed. In this regard, for multi-bank register-files capable of swapping banks that employ register-file cells in accordance with the invention, the swap control signals may be limited to two signals, one signal for swapping contents within a "cell", such as a single source driving swap control terminals 685 and 690, and one signal for swapping contents between cells, as illustrated in FIG. 6 by swap control terminal 640. Additional banks of a register-file may employ such swap control signals in a similar manner.

Figure 7:
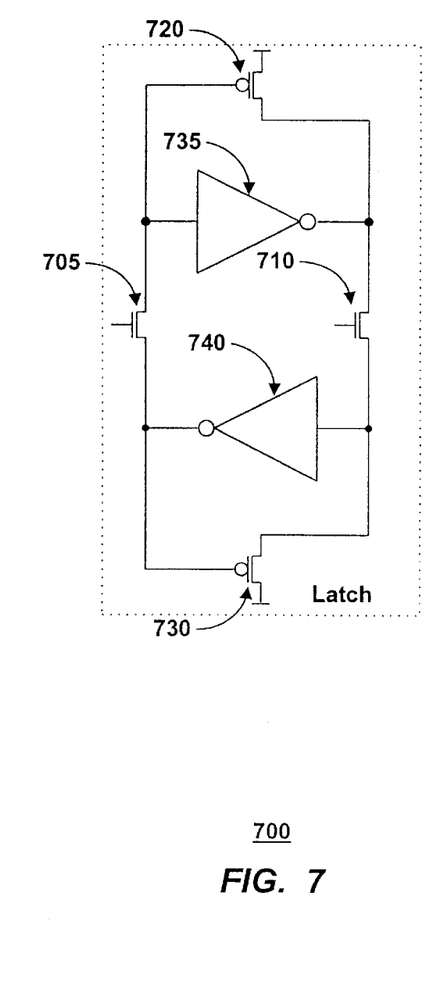
FIG. 7 is a schematic diagram illustrating another embodiment of a latch that may be employed by embodiments of a register-file in accordance with the invention.

FIG. 7 is schematic diagram of an alternative embodiment of a latch that may be employed by embodiments of the invention. While this particular embodiment is similar to the latch 300, illustrated in FIG. 3, it further comprises two p-channel transistors, 720 and 730. These transistors may, as was discussed with respect to the transmission gates in latch 350, reduce the effects of voltage threshold drops associated with pass-gates 310 and 320, for example. Such a latch may be employed in any of the foregoing embodiments, though the invention is, of course, not limited in this respect.

Figure 8:
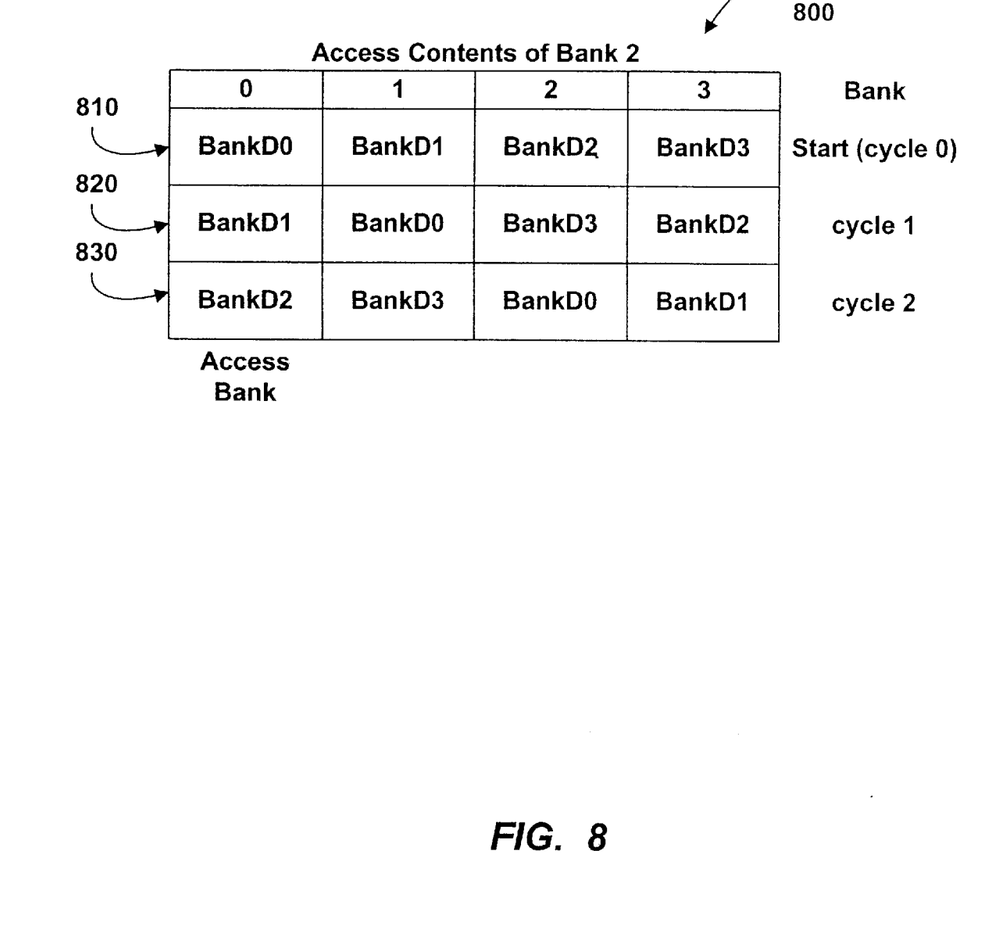
FIG. 8 is a table schematically illustrating an embodiment of a method in accordance with the invention.

FIG. 8 contains a table, which schematically illustrates an embodiment of a method for managing electronic data in multi-banked register files in accordance with the invention. While, of course, the invention is not limited in scope to this particular embodiment of a method, table 800 illustrates how a specific bank of a multi-banked register-file, such as one employing register-file cells in accordance with the invention, such as illustrated in FIG. 6, may be accessed. For this particular embodiment, the contents of Bank 2 are to be accessed. The initial contents of each bank, 0, 1, 2 and 3, at cycle 0, are indicated by the designations BankD0, BankD1, BankD2 and BankD3, respectively. As was discussed previously, for such embodiments, multi-banked register files typically have one read port and one write port. The specific register-file bank contents to be accessed are swapped or read to Bank 0. That is, for this specific scenario, BankD2 is moved to Bank 0, to be read via such a read port.

An embodiment of a method in accordance with the invention to accomplish this objective may comprise electrically decoupling the feedback paths in the latches of such a register-file. Once this feedback path is electrically decoupled, a logic 1 may be applied to the appropriate swap control terminal(s) to swap the contents of Bank 0 and Bank 1 and Bank 2 and Bank 3, such as terminal 685 and 690, for example. Once the contents of these banks are swapped, the contents of each register-file bank would be as illustrated in row 820 of table 800, designated cycle 1. Then logic 0 may be applied to the appropriate swap control terminal(s) to electrically decouple the banks. Then the feedback paths in the register-file latches may be restored to "latch" the swapped contents, that is stabilize the signals in the latches. Once the swapped contents are "latched", the feedback paths may again be electrically decoupled and then logic 1 may be applied to the appropriate swap control terminal(s), such as swap control terminal 640, for example, to swap the contents of Bank 0 and Bank 3 and the contents of Bank 1 and Bank 2. The contents of each bank, after this swap, would be as illustrated in row 830 of table 800, designated cycle 2. Logic 0 may then be applied to the swap control terminal and the feedback paths in the register-file latches may be electrically coupled. As indicated in row 830, BankD2 would then be present in Bank 0 and may be accessed via the read port of such a register-file.

While certain features of the invention have been illustrated and described herein, many modifications, substitutions, changes and equivalents will now occur to those skilled in the art. It is, therefore, to be understood that the appended claims are intended to cover all such modifications and changes as fall within the true spirit of the invention.

What is claimed is:

1. A circuit comprising:
a first plurality of latches including feedback control circuitry;
a plurality of data input terminals and data output terminals respectively coupled to alternative sides of said first plurality of latches;
a second plurality of latches including feedback control circuitry; and
said first and second plurality of latches coupled so as to exchange digital electronic signals stored therein between said first and second plurality based, at least in part, on applied control signals.

2. The circuit of claim 1, wherein said first and second plurality of latches are further coupled so as to have the capability to read said digital electronic signals between said plurality of latches, based, at least in part, on applied control signals.

3. A circuit comprising:
a plurality of latches including feedback control circuitry;
a plurality of data input terminals and data output terminals respectively coupled to alternative sides of said plurality of latches;
additional circuitry coupled to restore specific electronic signals, when stored in said plurality of latches, to a voltage substantially equivalent with a power supply voltage for said circuit; and
wherein said feedback control circuitry comprises pass-gates, and
wherein said plurality of latches are coupled via pass-gates.

4. The circuit of claim 3, wherein said additional circuitry comprises at least two p-channel transistors per latch for said plurality of latches.

5. An apparatus comprising:
a plurality of latches, including
a first latch and a second latch;
a swap control circuit;
wherein said plurality of latches and said swap control circuit are coupled so as to be capable of swapping, among said first and second latches in said plurality of latches, an electronic signal stored in said plurality of latches.

6. The apparatus of claim 5, further comprising
a read and a write port, and
wherein said first latch is coupled to said read and write ports.

7. The apparatus of claim 6, wherein said plurality of latches and said swap control circuit are coupled so as to be capable of making an electronic signal stored in said second latch accessible via said read port coupled to said first latch.

8. The apparatus of claim 5, wherein said plurality of latches and said swap control circuit are coupled so as to be capable of copying, to at least a second latch of said plurality of latches, an electronic signal stored in a first latch of said plurality of latches.

9. The apparatus of claim 5, wherein said swap control circuit comprises either transmission gates or pass-gates.

10. The apparatus of claim 5, further comprising
a feedback control circuit;
wherein said plurality of latches and said feedback control circuit are coupled so as to be capable of electronically coupling the latches of said plurality of latches in order to retain an electronic signal.

11. The apparatus of claim 10, wherein said plurality of latches and said feedback control circuit are coupled so as to be capable of electronically decoupling the latches of said plurality of latches in order to swap, among at least two latches in said plurality of latches, an electronic signal stored in said plurality of latches.

12. The apparatus of claim 10, wherein said feedback control circuit comprises either transmission gates or pass-gates.

* * * * *